United States Patent
Tapily et al.

(10) Patent No.: US 11,769,677 B2
(45) Date of Patent: *Sep. 26, 2023

(54) SUBSTRATE PROCESSING TOOL WITH INTEGRATED METROLOGY AND METHOD OF USING

(71) Applicant: Tokyo Electron Limited, Tokyo (JP)

(72) Inventors: Kandabara Tapily, Albany, NY (US); Robert Clark, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/682,202

(22) Filed: Feb. 28, 2022

(65) Prior Publication Data
US 2022/0181176 A1  Jun. 9, 2022

Related U.S. Application Data

(63) Continuation of application No. 16/355,579, filed on Mar. 15, 2019, now Pat. No. 11,264,254.
(Continued)

(51) Int. Cl.
*H01L 21/67* (2006.01)
*H01L 21/66* (2006.01)
(Continued)

(52) U.S. Cl.
CPC .... *H01L 21/67167* (2013.01); *C23C 16/0272* (2013.01); *C23C 16/06* (2013.01);
(Continued)

(58) Field of Classification Search
CPC ......... H01L 21/67167; H01L 21/67253; H01L 21/67207; H01L 22/20; H01L 21/31116;
(Continued)

(56) References Cited

U.S. PATENT DOCUMENTS

2002/0194716 A1  12/2002  Berner et al.
2005/0087873 A1   4/2005  Wu et al.
(Continued)

FOREIGN PATENT DOCUMENTS

JP   2003-179120 A   6/2003
JP   2009-64726 A    3/2009
TW   200834778 A     8/2008

OTHER PUBLICATIONS

Combined Taiwanese Office Action and Search Report dated Sep. 27, 2022 in Taiwanese Patent Applicaton No. 108109231 (with English translation), 19 pages.
(Continued)

*Primary Examiner* — Robert G Bachner
(74) *Attorney, Agent, or Firm* — Oblon, McClelland, Maier & Neustadt, L.L.P.

(57) ABSTRACT

A substrate processing method includes (a) providing a substrate in a substrate processing tool, the substrate containing an exposed surface of a first material layer and an exposed surface of a second material layer; (b) forming a self-assembled monolayer (SAM) on the substrate in a first substrate processing chamber (SPC); (c) transferring the substrate from the first SPC through a substrate transfer chamber to a second SPC; (d) depositing a film selectively on the first material layer and film nuclei on the SAM in the second SPC; (e) transferring, after selectively depositing the film on the first material layer, the substrate from the second SPC through the substrate transfer chamber to a third SPC; (f) removing the film nuclei from the SAM by etching in the third SPC; and repeating (b), (c), (d), (e) and (f) sequentially at least once.

15 Claims, 4 Drawing Sheets

Related U.S. Application Data

(60) Provisional application No. 62/645,685, filed on Mar. 20, 2018.

(51) Int. Cl.
  *H01L 21/311* (2006.01)
  *H01L 21/02* (2006.01)
  *C23C 16/06* (2006.01)
  *C23C 16/40* (2006.01)
  *C23C 16/02* (2006.01)
  *C23C 16/56* (2006.01)

(52) U.S. Cl.
  CPC .............. *C23C 16/40* (2013.01); *C23C 16/56* (2013.01); *H01L 21/02118* (2013.01); *H01L 21/31116* (2013.01); *H01L 21/67196* (2013.01); *H01L 21/67207* (2013.01); *H01L 21/67253* (2013.01); *H01L 22/20* (2013.01); *H01L 21/0228* (2013.01); *H01L 21/02178* (2013.01); *H01L 21/02181* (2013.01); *H01L 21/02189* (2013.01); *H01L 21/02271* (2013.01); *H01L 21/02274* (2013.01); *H01L 21/67069* (2013.01)

(58) Field of Classification Search
  CPC ......... H01L 21/02118; H01L 21/67196; H01L 21/67069; H01L 21/02178; H01L 21/02181; H01L 21/02189; H01L 21/02271; H01L 21/02274; H01L 21/0228; C23C 16/06; C23C 16/40; C23C 16/0272; C23C 16/56
  See application file for complete search history.

(56) References Cited

U.S. PATENT DOCUMENTS

| | | |
|---|---|---|
| 2007/0134821 A1 | 6/2007 | Thakur et al. |
| 2007/0196011 A1 | 8/2007 | Cox et al. |
| 2007/0264106 A1 | 11/2007 | Van Der Meulen |
| 2008/0276867 A1 | 11/2008 | Schaller |
| 2010/0267172 A1 | 10/2010 | Xiao et al. |
| 2011/0308453 A1 | 12/2011 | Su et al. |
| 2012/0185813 A1 | 7/2012 | Kaushal et al. |
| 2012/0195717 A1 | 8/2012 | Krupyshev et al. |
| 2015/0372119 A1 | 12/2015 | Zhang et al. |
| 2016/0293467 A1 | 10/2016 | Caveney et al. |
| 2017/0037513 A1 | 2/2017 | Haukka et al. |
| 2017/0244070 A1 | 8/2017 | Bangert et al. |
| 2017/0263466 A1 | 9/2017 | Ranish et al. |
| 2017/0271149 A1 | 9/2017 | Heo et al. |
| 2017/0271196 A1 | 9/2017 | Manna et al. |
| 2017/0323776 A1 | 11/2017 | Farm et al. |
| 2017/0350004 A1 | 12/2017 | Kaufman-Osborn et al. |

OTHER PUBLICATIONS

International Search Report and Written Opinion of the International Searching Authority dated Aug. 23, 2019, in PCT/US2019/022608, filed Mar. 15, 2019.

International Search Report and Written Opinion of the International Searching Authority dated Jul. 5, 2019, in PCT/US2019/022617, filed Mar. 15, 2019.

Taiwanese Office Action dated Mar. 7, 2023 in Taiwanese Patent Application No. 108109231 (with English translation), 20 pages.

SUBSTRATE PROCESSING TOOL WITH INTEGRATED METROLOGY AND METHOD OF USING

CROSS-REFERENCE TO RELATED APPLICATIONS

This application is a continuation of U.S. application Ser. No. 16/355,579 filed on Mar. 15, 2019, which related to and claims priority to U.S. Provisional Patent Application Ser. No. 62/645,685 filed on Mar. 20, 2018, the entire contents of each are herein incorporated by reference.

FIELD OF THE INVENTION

The present invention relates to substrate processing, and more particularly, to a substrate processing tool configured for performing integrated substrate processing and substrate metrology, and a method of using.

BACKGROUND OF THE INVENTION

As smaller transistors are manufactured, the critical dimension (CD) or resolution of patterned features is becoming more challenging to produce. Self-aligned patterning needs to replace overlay-driven patterning so that cost-effective scaling can continue even after EUV introduction. Patterning options that enable reduced variability, extend scaling and enhanced CD and process control are needed, however, it's getting extremely difficult to produce scaled devices at reasonably low cost. Selective deposition can significantly reduce the cost associated with advanced patterning. Selective deposition of thin films such as gap fill, area selective deposition of dielectrics and metals on specific substrates, and selective hard masks are key steps in patterning in highly scaled technology nodes.

SUMMARY OF THE INVENTION

Embodiments of the invention describe a substrate processing tool configured for performing integrated substrate processing and substrate metrology, and methods of processing a substrate.

According to one embodiment, a substrate processing tool includes a substrate transfer chamber, a plurality of substrate processing chambers coupled to the substrate transfer chamber, and a substrate metrology module coupled to the substrate transfer chamber.

According to one embodiment, a substrate processing method includes processing a substrate in a first substrate processing chamber of a substrate processing tool, transferring the substrate from the first substrate processing chamber through a substrate transfer chamber to a substrate metrology module in the substrate processing tool, performing metrology on the substrate in the substrate metrology module, transferring the substrate from the substrate metrology module to a second substrate processing chamber through the substrate transfer chamber, and processing the substrate in the second substrate processing chamber.

According to one embodiment, a substrate processing method includes (a) providing a substrate in a substrate processing tool, the substrate containing an exposed surface of a first material layer and an exposed surface of a second material layer; (b) forming a self-assembled monolayer (SAM) on the substrate in a first substrate processing chamber; (c) transferring the substrate from the first substrate processing chamber through a substrate transfer chamber to a second substrate processing chamber; (d) depositing a film selectively on the first material layer and film nuclei on the self-assembled monolayer in the second substrate processing chamber; (e) transferring, after selectively depositing the film on the first material layer, the substrate from the second substrate processing chamber through the substrate transfer chamber to a third substrate processing chamber; (f) removing the film nuclei from the self-assembled monolayer by etching in the third substrate processing chamber; and repeating (b), (c), (d), (e) and (f) sequentially at least once.

BRIEF DESCRIPTION OF THE DRAWINGS

A more complete appreciation of embodiments of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Embodiments of the invention describe a substrate processing tool configured for performing integrated substrate processing and substrate metrology, and methods of processing a substrate.

Embodiments of the invention address integrated substrate processing and the need for performing substrate metrology during the integrated substrate processing. In one example, during area selective film deposition in a substrate processing tool, substrate metrology may be performed in the processing tool following a film deposition step to measure and characterize loss of deposition selectivity and, based on substrate metrology data, perform removal of undesired film nuclei to achieve selective film formation. The results from the substrate metrology step may be used to tune the film nuclei removal step based on variation in the film deposition step. Further, artificial intelligence (AI) may be used to analyze the substrate metrology results and predict future film thickness and film deposition selectivity.

Figure 1:
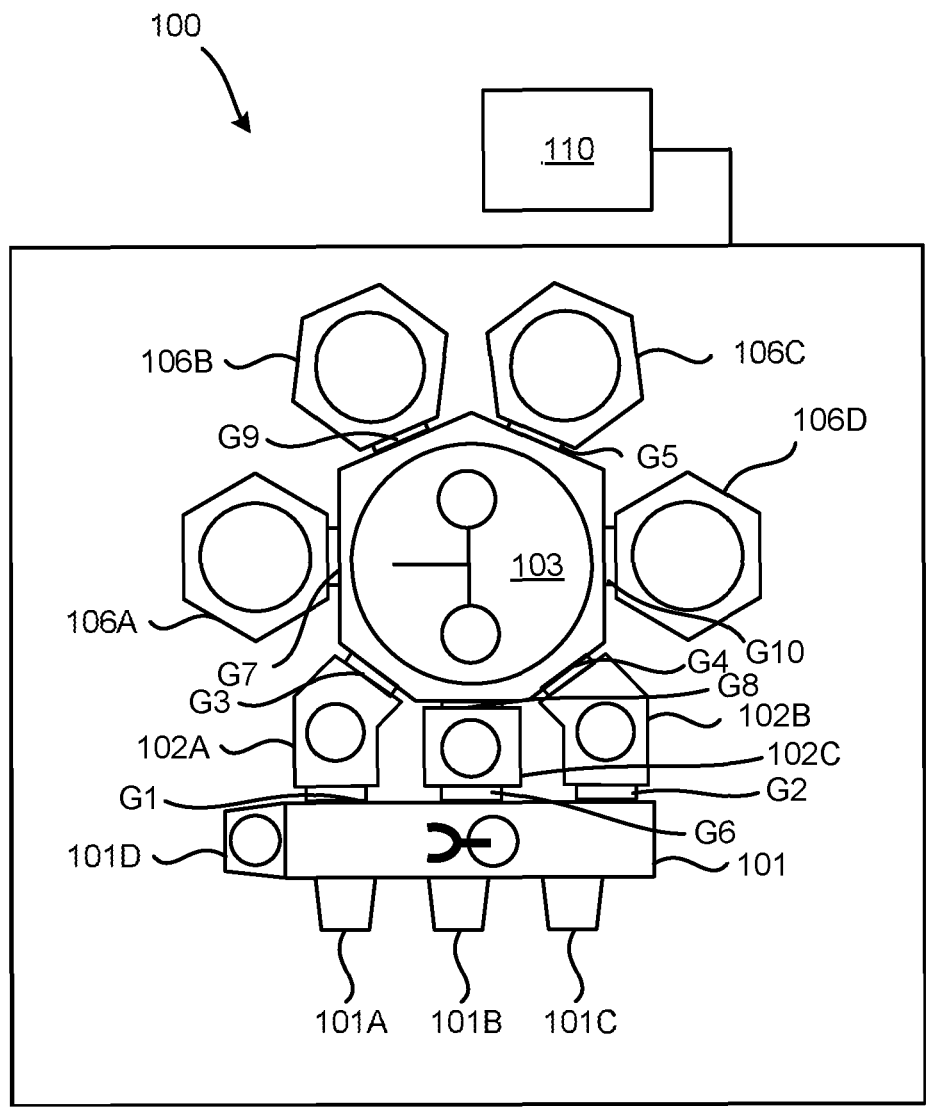
FIG. 1 is a schematic diagram of a substrate processing tool configured for performing integrated substrate processing and substrate metrology according to an embodiment of the invention.

FIG. 1 is a schematic diagram of a substrate processing tool configured for performing integrated substrate processing and substrate metrology according to embodiments of the invention. The substrate processing tool 100 contains a substrate (wafer) transfer system 101 that includes cassette modules 101A, 101B, and 101C, and a substrate alignment module 101D. Load-lock chambers 102A and 102B, and substrate metrology module 102C, are coupled to the substrate transfer system 101. The substrate transfer system 101 is maintained at atmospheric pressure but a clean environment is provided by purging with an inert gas. The load lock chambers 102A and 102B are coupled to a substrate transfer chamber 103 and may be used for transferring substrates from the substrate transfer system 101 to the substrate transfer chamber 103. The substrate transfer chamber 103 may be maintained at a very low base pressure (e.g., $5\times10^{-8}$ Torr, or lower) or constantly purged with an inert gas.

The substrate metrology module 102C may be operated under atmospheric pressure or operated under vacuum conditions and can include one or more analytical tools that are capable of measuring one or more material and electronic properties of a substrate and/or thin films and layers deposited on a substrate. Some or all components of the one or more analytical tools may located in the vacuum environment in the substrate metrology module 102C. In one example, a light source may be positioned outside the substrate metrology module 102C and light from the light source may be transmitted into the substrate metrology module 102C and onto a substrate through a window. Alternatively, the light source may be positioned inside the substrate metrology module 102C.

Exemplary analytical tools can include X-ray photoelectron spectroscopy (XPS) for measuring elemental composition, empirical formula, chemical state and electronic state of materials; X-ray reflectometry (XRR) for characterizing surfaces, thin films and multilayers; X-ray fluorescence (XRF) for elemental analysis and chemical analysis of materials; Fourier-transform infrared spectroscopy (FTIR) for characterizing materials; ultraviolet/visible (UV/Vis) spectroscopy for measuring thickness and optical properties of thin films; optical scatterometry for characterizing surfaces, thin films and multilayers; ellipsometry for characterizing composition, roughness, thickness (depth), crystalline nature, doping concentration, electrical conductivity and other material properties of thin films; and analytical tools for measuring substrate bow and warp.

Coupled to the substrate transfer chamber 103 are substrate processing chambers 106A-106D that are configured for processing substrates, such as Si wafers. The Si wafers can, for example, have a diameter of 150 mm, 200 mm, 300 mm, 450 mm, or larger than 450 mm. According to one embodiment of the invention, the first substrate processing chamber 106A can perform a treatment process on a substrate, and the second substrate processing chamber 106B can form a self-aligned monolayer (SAM) on a substrate. The third substrate processing chamber 106C can etch or clean a substrate, and the fourth substrate processing chamber 106D can deposit a film on a substrate by vapor deposition such as atomic layer deposition (ALD), plasma-enhanced ALD (PEALD), chemical vapor deposition (CVD), or plasma-enhanced CVD (PECVD). The substrate transfer chamber 103 is configured for transferring substrates between any of the substrate processing chambers 106A-106D, and into the substrate metrology module 102C. FIG. 1 further shows gate valves G1-G9 that provide isolation between adjacent processing tool components. As depicted in the embodiment of FIG. 1, the substrate processing chambers 106A-106D and the substrate metrology module 102C may be directly coupled to the substrate transfer chamber 103 by the gate valves G5, G7, G8, G9, and G10. This direct coupling can greatly improve substrate throughput.

The substrate processing tool 100 includes a controller 110 that can be coupled to and control any or all of the tool components depicted in FIG. 1 during the integrated substrate processing and substrate metrology. Alternatively, or in addition, the controller 110 can be coupled to one or more additional controllers/computers (not shown), and the controller 110 can obtain setup and/or configuration information from an additional controller/computer. The controller 110 can be used to configure any or all of the substrate processing chambers and processing elements, and the controller 110 can collect, provide, process, store, and display data from any or all of the tool components. The controller 110 can comprise a number of applications for controlling any or all of the tool components. For example, controller 110 can include a graphic user interface (GUI) component that can provide easy to use interfaces that enable a user to monitor and/or control one or more tool components.

The controller 110 can include a microprocessor, memory, and a digital I/O port capable of generating control voltages sufficient to communicate, activate inputs, and exchange information with the substrate processing tool 100 as well as monitor outputs from the substrate processing tool 100. For example, a program stored in the memory may be utilized to activate the inputs of the substrate processing tool 100 according to a process recipe in order to perform integrated substrate processing. The controller 110 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 110 may be locally located relative to the substrate processing tool 100, or it may be remotely located relative to the substrate processing tool 100. For example, the controller 110 may exchange data with the substrate processing tool 100 using at least one of a direct connection, an intranet, the Internet and a wireless connection. The controller 110 may be coupled to an intranet at, for example, a customer site (i.e., a device maker, etc.), or it may be coupled to an intranet at, for example, a vendor site (i.e., an equipment manufacturer). Additionally, for example, the controller 110 may be coupled to the Internet. Furthermore, another computer (i.e., controller, server, etc.) may access, for example, the controller 110 to exchange data via at least one of a direct connection, an intranet, and the Internet. As also would be appreciated by those skilled in the art, the controller 110 may exchange data with the substrate processing tool 100 via a wireless connection.

Substrate Processing Examples

Referring now to FIG. 1, FIGS. 2A-2E, and FIG. 3, according to one embodiment, the substrate processing tool 100 may be configured to perform and monitor a method of area selective deposition on a substrate. In this embodiment, the substrate 200 contains a base layer 202, an exposed surface of a first material layer 204 and an exposed surface of a second material layer 206. In one example, the substrate 200 includes a dielectric layer 204 and a metal layer 206. For example, the metal layer 206 can contain Cu, Al, Ta, Ti, W, Ru, Co, Ni, or Mo. The dielectric layer 204 can, for example, contain $SiO_2$, a low-k dielectric material, or a high-k dielectric material. Low-k dielectric materials have a nominal dielectric constant less than the dielectric constant of $SiO_2$, which is approximately 4 (e.g., the dielectric constant for thermally grown silicon dioxide can range from 3.8 to 3.9).

High-k materials have a nominal dielectric constant greater than the dielectric constant of $SiO_2$.

Low-k dielectric materials may have a dielectric constant of less than 3.7, or a dielectric constant ranging from 1.6 to 3.7. Low-k dielectric materials can include fluorinated silicon glass (FSG), carbon doped oxide, a polymer, a SiCOH-containing low-k material, a non-porous low-k material, a porous low-k material, a spin-on dielectric (SOD) low-k material, or any other suitable dielectric material. The low-k dielectric material can include BLACK DIAMOND® (BD) or BLACK DIAMOND® II (BDII) SiCOH material, commercially available from Applied Materials, Inc., or Coral® CVD films commercially available from Novellus Systems, Inc. Other commercially available carbon-containing materials include SILK® (e.g., SiLK-I, SiLK-J, SiLK-H, SiLK-D, and porous SiLK semiconductor dielectric resins) and CYCLOTENE® (benzocyclobutene) available from Dow Chemical, and GX-3™, and GX-3P™ semiconductor dielectric resins available from Honeywell.

Low-k dielectric materials include porous inorganic-organic hybrid films comprised of a single-phase, such as a silicon oxide-based matrix having $CH_3$ bonds that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process.

In addition, low-k materials include a silicate-based material, such as hydrogen silsesquioxane (HSQ) or methyl silsesquioxane (MSQ), deposited using SOD techniques. Examples of such films include FOx® HSQ commercially available from Dow Corning, XLK porous HSQ commercially available from Dow Corning, and JSR LKD-5109 commercially available from JSR Microelectronics.

The method further includes, in step 302 of the process flow 300, providing the substrate 200 into the substrate transfer system 101, and thereafter, transferring the substrate 200 into the substrate transfer chamber 103.

Thereafter, in step 304, the substrate 200 is optionally transferred into the substrate metrology module 102C where the substrate 200 is measured and characterized.

In step 306, the substrate 200 is optionally transferred into the first substrate processing chamber 106A for treating with a treatment gas. For example, the treatment gas can include an oxidizing gas or a reducing gas. In some examples, the oxidizing gas can include $O_2$, $H_2O$, $H_2O_2$, isopropyl alcohol, or a combination thereof, and the reducing gas can include $H_2$ gas. The oxidizing gas may be used to oxidize a surface of the first material layer 204 or the second material 206 to improve subsequent area selective deposition. In one example, the treatment gas can contain or consist of plasma-excited Ar gas.

In step 308, the substrate 200 is optionally transferred into the substrate metrology module 102C where the treating of the substrate 200 in step 306 is measured and characterized.

Thereafter, the substrate is transferred into the second substrate processing chamber 106B where a self-aligned monolayer (SAM) is formed on the substrate 200 in step 310. The SAM may be formed on the substrate 200 by exposure to a reactant gas that contains a molecule that is capable of forming a SAM on the substrate 200. The SAM is a molecular assembly that is formed spontaneously on substrate surfaces by adsorption and organized into more or less large ordered domains. The SAM can include a molecule that possesses a head group, a tail group, and a functional end group, and the SAM is created by the chemisorption of head groups onto the substrate 200 from the vapor phase at room temperature or above room temperature, followed by a slow organization of the tail groups. Initially, at small molecular density on the surface, adsorbate molecules form either a disordered mass of molecules or form an ordered two-dimensional "lying down phase", and at higher molecular coverage, over a period of minutes to hours, begin to form three-dimensional crystalline or semicrystalline structures on the substrate surface. The head groups assemble together on the substrate, while the tail groups assemble far from the substrate.

According to one embodiment, the head group of the molecule forming the SAM can include a thiol, a silane, or a phosphonate. Examples of silanes include molecule that include C, H, Cl, F, and Si atoms, or C, H, Cl, and Si atoms. Non-limiting examples of the molecule include perfluorodecyltrichlorosilane ($CF_3(CF_2)_7CH_2CH_2SiCl_3$), perfluorodecanethiol ($CF_3(CF_2)_7CH_2CH_2SH$), chlorodecyldimethylsilane ($CH_3(CH_2)_8CH_2Si(CH_3)_2Cl$), and tertbutyl(chloro)dimethylsilane (($CH_3)_3CSi(CH_3)_2Cl$)).

The presence of the SAM on a substrate 200 to may be used to enable subsequent selective film deposition on the first material layer 204 (e.g., a dielectric layer) relative to the second material layer 206 (e.g., a metal layer). This selective deposition behavior is unexpected and provides a new method for selectively depositing a film on the first material layer 204 while preventing or reducing metal oxide deposition on the second material layer 206. It is speculated that the SAM density is greater on the second material layer 206 relative to on the first material layer 204, possibly due to higher initial ordering of the molecules on the second material layer 206 relative to on the first material layer 204. This greater SAM density on the second material layer 206 is schematically shown as SAM 208 in FIG. 2B.

Following the formation of the SAM 208 on the substrate 200, in step 312, the substrate 200 is optionally transferred into the substrate metrology module 102C where the formation of the SAM 208 on the substrate 200 is measured and characterized.

Thereafter, the substrate 200 is transferred into the fourth substrate processing chamber 106D where, in step 314, a film 210 (e.g., a metal oxide film) is selectively deposited on the first material layer 204 relative to on the second material layer 206 containing the SAM 208 by exposing the substrate 200 to one or more deposition gases. In one example, the film 210 may include a metal oxide film that contains $HfO_2$, $ZrO_2$, or $Al_2O_3$. The film 210 may, for example, be deposited by CVD, plasma-enhanced CVD PEALD), ALD or plasma-enhanced ALD (PEALD). In some examples, the film 210 may be deposited by ALD using alternating exposures of a metal-containing precursor and an oxidizer (e.g., $H_2O$, $H_2O_2$, plasma-excited $O_2$, or $O_3$).

Figure 2A:
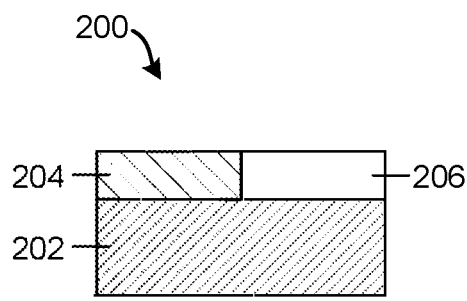
FIGS. 2A-2E show through schematic cross-sectional views a method of area selective film formation according to an embodiment of the invention.
Figure 2B:
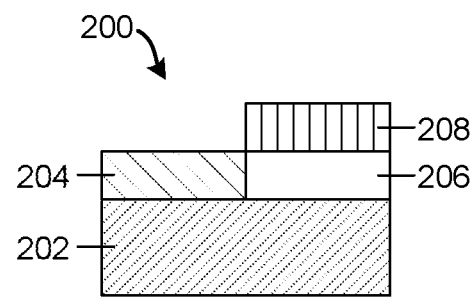
Figure 2C:
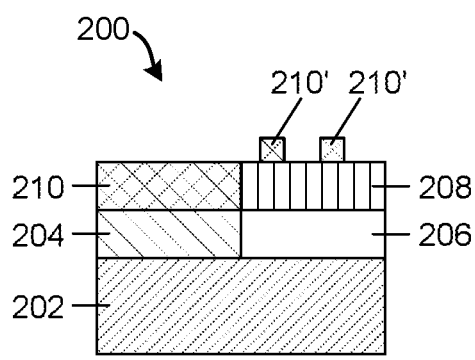
Figure 2D:
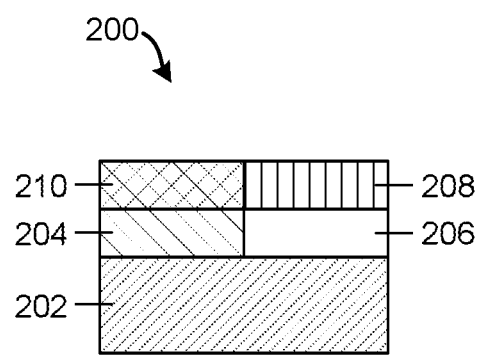
Figure 2E:
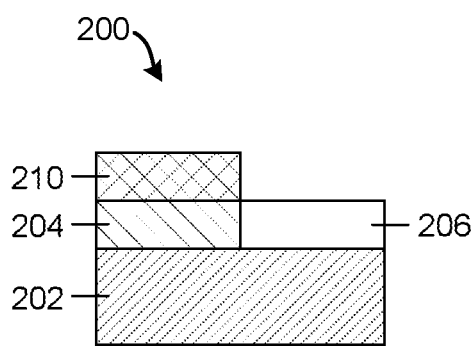
Figure 3:
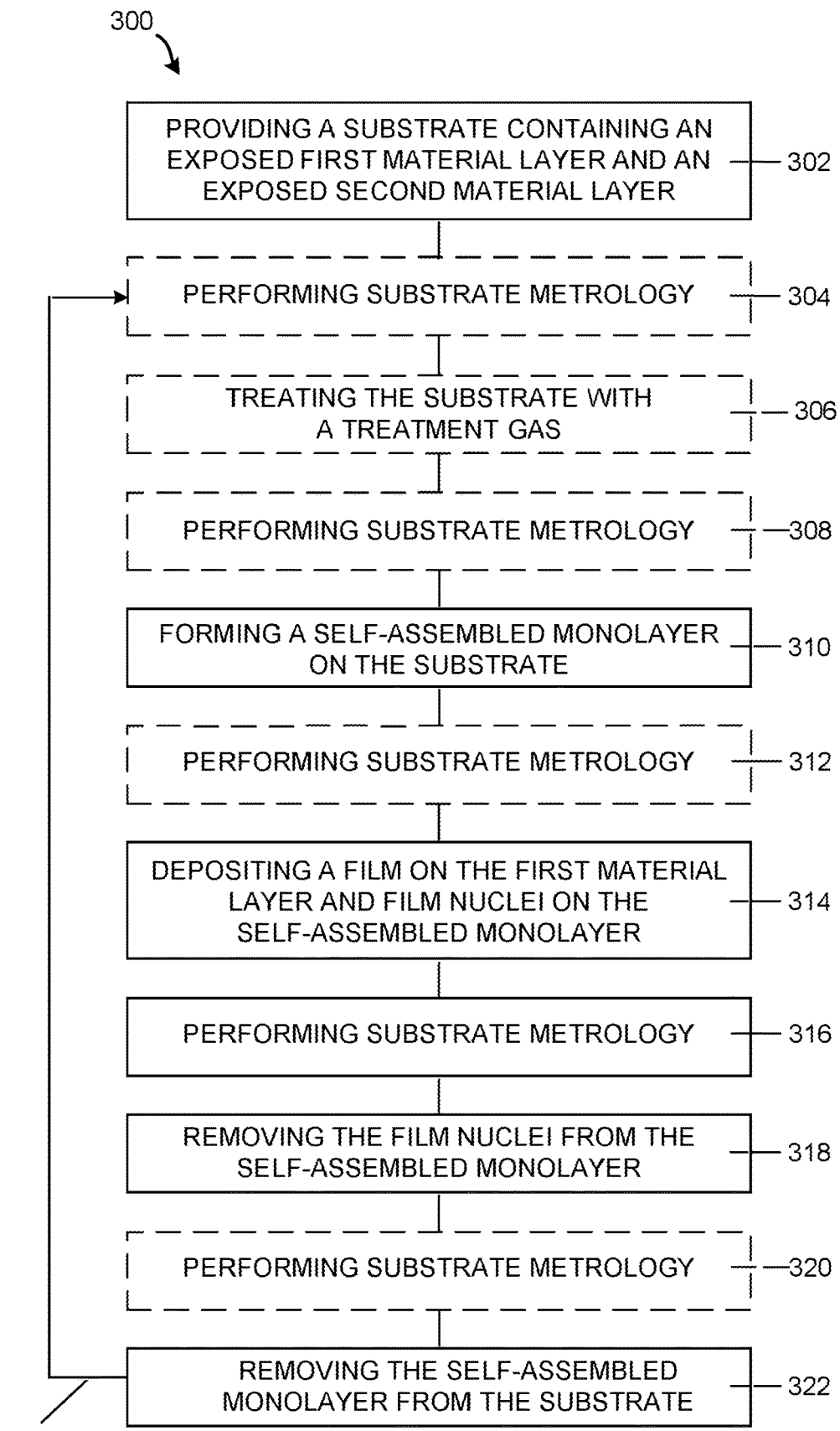
FIG. 3 is a process flow diagram for performing integrated substrate processing and substrate metrology according to an embodiment of the invention.

As depicted in FIG. 2C, the exposure to the one or more deposition gases in the third substrate processing chamber 106C may, in addition to depositing the film 210 on the first material layer 204, deposit film nuclei 210' on the SAM 208. This loss of deposition selectivity can occur if the deposition process is carried out for too long or if the deposition selectivity between the first material layer 204 and the SAM 208 is poor. Poor deposition selectivity can also occur if surface coverage of the SAM 208 is incomplete and contains voids on the second material layer 206.

Following the deposition of the film 210 on the substrate 200, in step 316, the substrate 200 is transferred into the substrate metrology module 102C where the deposition of the film 210 is measured and characterized. The characterization can determine the degree of deposition selectivity and the removal needed of the film nuclei 210' from the SAM 208.

The film nuclei 210' on the SAM 208 may be removed using an etching process in order to selectively form the film 210 on the first material layer 204. The substrate 200 is transferred into the third substrate processing chamber 106C to perform the etching process in step 318. Although the film 210 may also be partially removed by the etching process, the metal oxide nuclei 210' are expected to etch faster than the film 210. The etching process can include a dry etching process, a wet etching process, or a combination thereof. In one example, the etching process may include an atomic layer etching (ALE) process. The resulting substrate 200 shown in FIG. 2D has the film 210 selectively formed on the first material layer 204.

Following the etching process, in step 320, the substrate 200 is optionally transferred into the substrate metrology module 102C where the substrate 200 is measured and characterized. The characterization can determine the extent of the etching process.

Thereafter, in step 322, the SAM 208 may be removed from the substrate 200, for example by etching or cleaning in the third substrate processing chamber 106C or by a heat-treatment in the first substrate processing chamber 106A.

As schematically shown by process arrow 324, the above-described substrate processing steps 304-322, may be repeated one or more times to increase the thickness of the film 210 on the substrate 200. Removal and subsequent repeated deposition of the SAM 208 on the substrate 200 may be desired if the SAM 208 becomes damaged during the film deposition and/or the etching process and therefore affects the film deposition selectivity.

Figure 4:
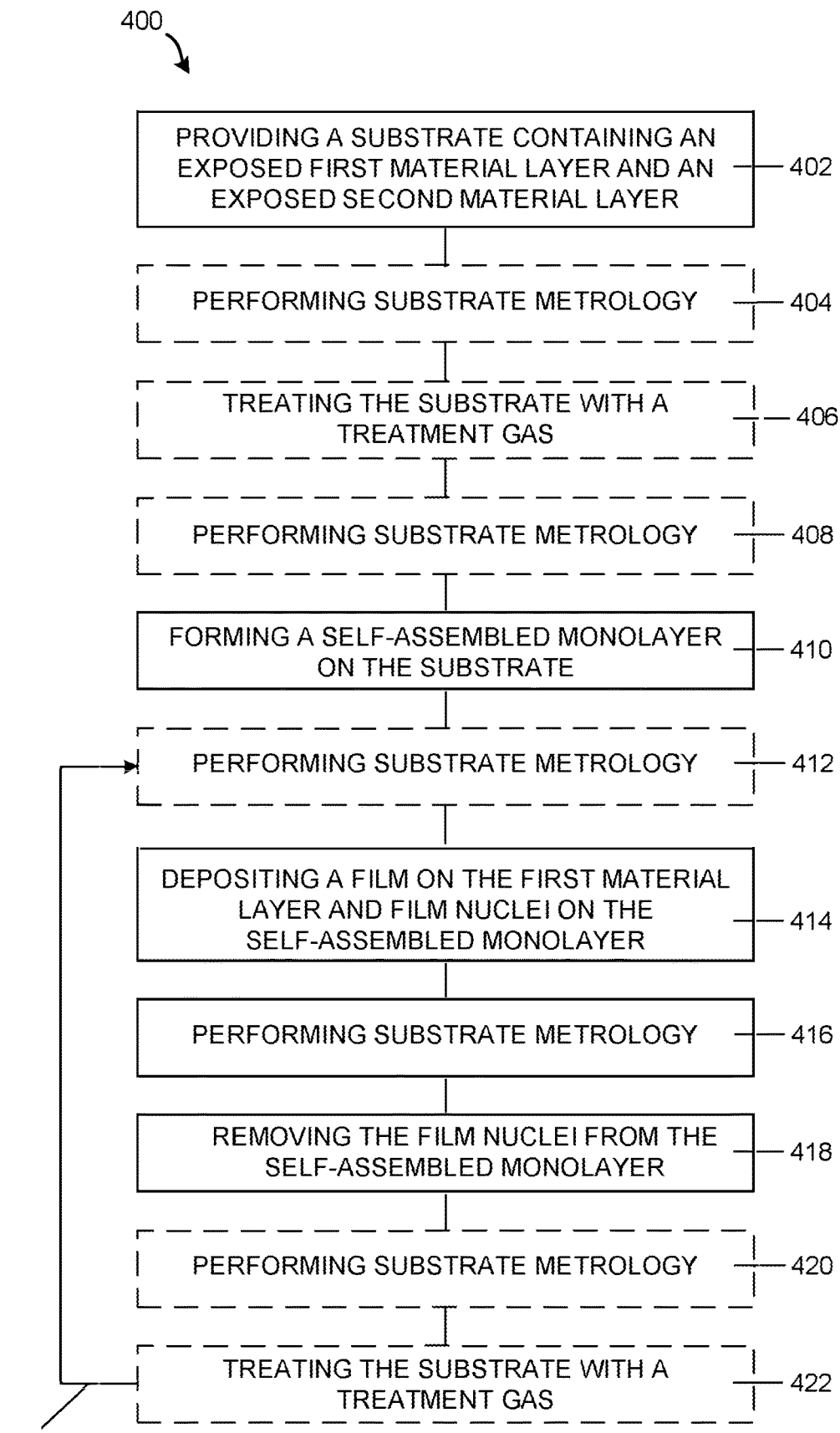
FIG. 4 is a process flow diagram for performing integrated substrate processing and substrate metrology according to another embodiment of the invention.

FIG. 4 is a process flow diagram for performing integrated substrate processing and substrate metrology according to an embodiment of the invention. Also referring to FIG. 1 and FIGS. 2A-2E, the process flow diagram 400 in FIG. 4 is similar to the process flow diagram 300 in FIG. 3 and includes, in step 402, providing a substrate 200 in a substrate processing tool 100, where the substrate 200 contains an exposed surface of a first material layer 204 and an exposed surface of a second material layer 206. In one example, the first material layer 204 includes a dielectric layer and the second material layer 206 includes a metal layer. The method further includes, in step 404, optionally performing substrate metrology, in step 406, optionally treating the substrate 200 with a treatment gas, and in step 408, optionally performing substrate metrology.

The method further includes, in step 410, forming a SAM 208 on the substrate 200, and in step 412, optionally performing substrate metrology. The method further includes, in step 414, depositing a film 210 on the first material layer 204 and film nuclei 210' on the SAM 208, and in step 416, performing substrate metrology. The method further includes, in step 418, removing film nuclei 210' from the SAM 208, and in step 420, optionally performing substrate metrology. The further includes, in 422, optionally treating the substrate 200 with a treatment gas. As schematically shown by process arrow 424, the above-described substrate processing steps 412-422, may be repeated one or more times to increase the thickness of the film 210 on the substrate 200.

A substrate processing tool configured for performing integrated substrate processing and substrate metrology, and a method of area selective deposition have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, comprising:
   (a) providing a substrate in a substrate processing tool, the substrate containing an exposed surface of a first material layer and an exposed surface of a second material layer;
   (b) forming a self-assembled monolayer (SAM) on the substrate in a first substrate processing chamber;
   (c) transferring the substrate from the first substrate processing chamber through a substrate transfer chamber to a second substrate processing chamber;
   (d) depositing a film selectively on the first material layer and film nuclei on the self-assembled monolayer in the second substrate processing chamber;
   (e) transferring, after selectively depositing the film on the first material layer, the substrate from the second substrate processing chamber through the substrate transfer chamber to a third substrate processing chamber;
   (f) removing the film nuclei from the self-assembled monolayer by etching in the third substrate processing chamber; and
   repeating (b), (c), (d), (e) and (f) sequentially at least once.

2. The substrate processing method of claim 1, further comprising:
   (g) removing the SAM from the substrate.

3. The substrate processing method of claim 2, further comprising:
   repeating (b), (c), (d), (e), (f) and (g) sequentially at least once.

4. The substrate processing method of claim 2, wherein (g) comprises etching or cleaning the SAM in the third substrate processing chamber.

5. The substrate processing method of claim 2, wherein (g) comprises heating the SAM in a fourth substrate processing chamber.

6. The substrate processing method of claim 1, further comprising:
   transferring, after (d), the substrate from the second substrate processing chamber through the substrate transfer chamber to a substrate metrology module;
   performing metrology on the film in the substrate metrology module to characterize a loss of deposition selectivity on the substrate; and
   transferring, after performing the metrology, the substrate from the substrate metrology module through the substrate transfer chamber to the third substrate processing chamber.

7. The substrate processing method of claim 6, wherein (f) comprises removing the film nuclei from the self-assembled monolayer by etching in the third substrate processing chamber based on the characterized loss of the deposition selectivity.

8. The substrate processing method of claim 6, wherein:
the substrate metrology module has a first end connected to the substrate transfer chamber and a second end connected to a transfer system,
the first end of the substrate metrology module is directly coupled to the substrate transfer chamber by a first gate valve, and the second end of the substrate metrology module is directly coupled to the transfer system by a second gate valve, and
the first gate valve separates the substrate metrology module from the substrate transfer chamber, and the second gate valve separates the transfer system from the substrate metrology module.

9. The substrate processing method of claim 1, further comprising:
performing a treatment process on the substrate in a fourth substrate processing chamber using a reactive treatment gas, heat-treatment, or a combination thereof.

10. The substrate processing method of claim 1, wherein the first material layer comprises a dielectric layer.

11. The substrate processing method of claim 1, wherein the second material layer comprises a metal layer.

12. The substrate processing method of claim 11, wherein the metal layer comprises Cu, Al, Ta, Ti, W, Ru, Co, Ni, or Mo.

13. The substrate processing method of claim 1, wherein the film comprises a metal oxide.

14. The substrate processing method of claim 1, wherein a density of the SAM is greater on the second material layer than on the first material layer.

15. The substrate processing method of claim 1, wherein the SAM includes a plurality of molecules containing a head group, a tail group, and a functional end group, wherein the head group includes a thiol, a silane, or a phosphonate.

* * * * *

UNITED STATES PATENT AND TRADEMARK OFFICE
CERTIFICATE OF CORRECTION

| | | |
|---|---|---|
| PATENT NO. | : 11,769,677 B2 | |
| APPLICATION NO. | : 17/682202 | |
| DATED | : September 26, 2023 | |
| INVENTOR(S) | : Tapily et al. | |

It is certified that error appears in the above-identified patent and that said Letters Patent is hereby corrected as shown below:

On the Title Page

Item (56), under "OTHER PUBLICATIONS", Line 2, delete "Applicaton" and insert -- Application --, therefor.

Signed and Sealed this
Sixth Day of February, 2024

Katherine Kelly Vidal
*Director of the United States Patent and Trademark Office*